US011556689B2

(12) United States Patent
Garcia et al.

(10) Patent No.: US 11,556,689 B2
(45) Date of Patent: Jan. 17, 2023

(54) LAYOUT OF PHOTONIC INTEGRATED CIRCUITS USING FIXED COORDINATE GRIDS

(71) Applicant: Synopsys, Inc., Mountain View, CA (US)

(72) Inventors: Francesc Vila Garcia, Hengelo (NL); Remco Stoffer, Enschede (NL)

(73) Assignee: Synopsys, Inc., Mountain View, CA (US)

( * ) Notice: Subject to any disclaimer, the term of this patent is extended or adjusted under 35 U.S.C. 154(b) by 25 days.

(21) Appl. No.: 17/233,343

(22) Filed: Apr. 16, 2021

(65) Prior Publication Data
US 2021/0326508 A1    Oct. 21, 2021

Related U.S. Application Data

(60) Provisional application No. 63/011,554, filed on Apr. 17, 2020.

(51) Int. Cl.
*G06F 30/398* (2020.01)
*G06F 30/392* (2020.01)
*G02B 27/00* (2006.01)

(52) U.S. Cl.
CPC ....... *G06F 30/392* (2020.01); *G02B 27/0012* (2013.01); *G06F 30/398* (2020.01)

(58) Field of Classification Search
CPC .......... G06F 3/013; G06F 3/017; G06F 1/163; G06F 3/005; G06F 3/011; G06F 3/03547; G06F 3/04815; G06F 13/00; G06F 3/012; G06F 3/014; G06F 3/0227; G06F 3/0346; G06F 3/0488; G06F 3/167; G06F 30/392; G06F 30/398; G06F 2203/0331; G06F 2203/0338; G06F 3/016; G06F 3/0304;
(Continued)

(56) References Cited

U.S. PATENT DOCUMENTS

| 2016/0012176 A1* | 1/2016 | Liu | G02B 6/125 |
| | | | 716/112 |
| 2016/0171149 A1* | 6/2016 | Alloatti | G06F 30/392 |
| | | | 716/52 |
| 2020/0116489 A1* | 4/2020 | Wang | G02B 6/29302 |

OTHER PUBLICATIONS

Bogaerts, W. et al. "Silicon Photonics Circuit Design: Methods, Tools, and Challenges." Laser & Photonics Reviews, vol. 12, No. 4, Apr. 2018, pp. 1-29.
(Continued)

*Primary Examiner* — Binh C Tat
(74) *Attorney, Agent, or Firm* — Fenwick & West LLP

(57) ABSTRACT

Embodiments relate to the layout of photonic integrated circuits using fixed coordinate grids. In some embodiments, a method includes receiving a request to place a first photonic component within a layout of a photonic integrated circuit. Positionings of components within the layout are represented in a design database utilizing a grid with fixed coordinates. The method further includes calculating, by a processor, precise coordinates and snapped coordinates for positioning of the first photonic component. The snapped coordinates have a precision consistent with the fixed coordinate grid and the precise coordinates have a higher precision than the snapped coordinates. The method further includes, in a design database, representing the positioning of the first photonic component utilizing both the precise coordinates and the snapped coordinates.

19 Claims, 15 Drawing Sheets

(58) Field of Classification Search
CPC .... G06F 3/0428; G06F 21/32; G06F 2117/10; G06F 3/0233; G06F 3/0236; G06F 3/04842; G06F 3/14; G06F 3/165; G06F 30/396; G06N 3/0454; G06N 10/00; H01L 21/8258; H01L 22/34; H01L 23/544; H01L 29/0673; H01L 45/1608; H01L 29/0847
USPC .................................................. 716/118–125
See application file for complete search history.

(56) References Cited

OTHER PUBLICATIONS

Condrat, C. et al. "A Methodology for Physical Design Automation for Integrated Optics." 2012 IEEE 55$^{th}$ International Midwest Symposium on Circuits and Systems (MWSCAS), Aug. 5-8, 2012, pp. 598-601.
Luceda Photonics. "Filter Toolbox AWG Designer." YouTube.com, Aug. 8, 2017, 1 page, [Online] [Retrieved Sep. 2, 2021], Retrieved from the Internet <URL:https://www.youtube.com/watch?v=-D8ttDjtO-s>.
PCT International Search Report and Written Opinion, PCT Application No. PCT/US2021/027809, dated Jul. 26, 2021, 17 pages.
White, R. "Tanner EDA L-edit (Layout Editor)." Tanner.com, May 14, 2012, pp. 1-43.
Halperin, D. et al., "Iterated snap rounding," Computational Geometry, 2002, pp. 209-225, vol. 23, No. 2.

\* cited by examiner

LAYOUT OF PHOTONIC INTEGRATED CIRCUITS USING FIXED COORDINATE GRIDS

RELATED APPLICATION

This application claims the benefit of U.S. Provisional Application No. 63/011,554, "Method for Generating Masks for Photonic Devices", filed Apr. 17, 2020, which is incorporated by reference in its entirety.

TECHNICAL FIELD

The present disclosure relates to physical layout of photonic integrated circuits. Such layouts may be used to generate lithographic masks used for the fabrication of the photonic devices.

BACKGROUND

A photonic integrated circuit is a device that integrates multiple photonic components on a single device and processes the information signals in the form of light waves. Photonic integrated circuits are designed and fabricated using tools and processes based on the semiconductor electronics industry. For example, design flows analogous to those used to design electronic integrated circuits may be used to design photonic integrated circuits. Software tools for the physical layout of the devices and for the generation of masks used in fabrication may also be similar to those used in the electronics industry. Semiconductor processes used to fabricate electronic devices may be used or adapted to fabricate photonic devices.

In many cases, photonic integrated circuits may combine photonics and electronics on the same device. For example, some functions may be performed by photonics and others by electronics. Devices such as lasers and other types of optical transmitters may be used to convert signals from electrical to optical form, and devices such as sensors and other types of optical receivers may be used to convert signals from optical to electrical form. Electrical signals may also be used to control photonic devices, such as electro-optic modulators and optical amplifiers.

SUMMARY

Embodiments relate to the layout of photonic integrated circuits using fixed coordinate grids. In some embodiments, a method includes receiving a request to place a first photonic component within a layout of a photonic integrated circuit. Positionings of components within the layout are represented in a design database utilizing a grid with fixed coordinates. The method further includes calculating, by a processor, precise coordinates and snapped coordinates for positioning of the first photonic component. The snapped coordinates have a precision consistent with the fixed coordinate grid and the precise coordinates have a higher precision than the snapped coordinates. The method further includes, in a design database, representing the positioning of the first photonic component utilizing both the precise coordinates and the snapped coordinates.

In some embodiments, the request to place the first photonic component includes a request to align a first optical port of the first photonic component to a second optical port of a previously placed second photonic component in the layout. Calculating the precise coordinates for positioning of the first photonic component is based on the precise coordinates representing the positioning of the second photonic component.

In some embodiments, a system includes a memory storing instructions and a processor. The processor is coupled with the memory and executes the instructions. The instructions when executed cause the processor to use precise coordinates and snapped coordinates for positioning photonic components within a layout of a photonic integrated circuit. Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
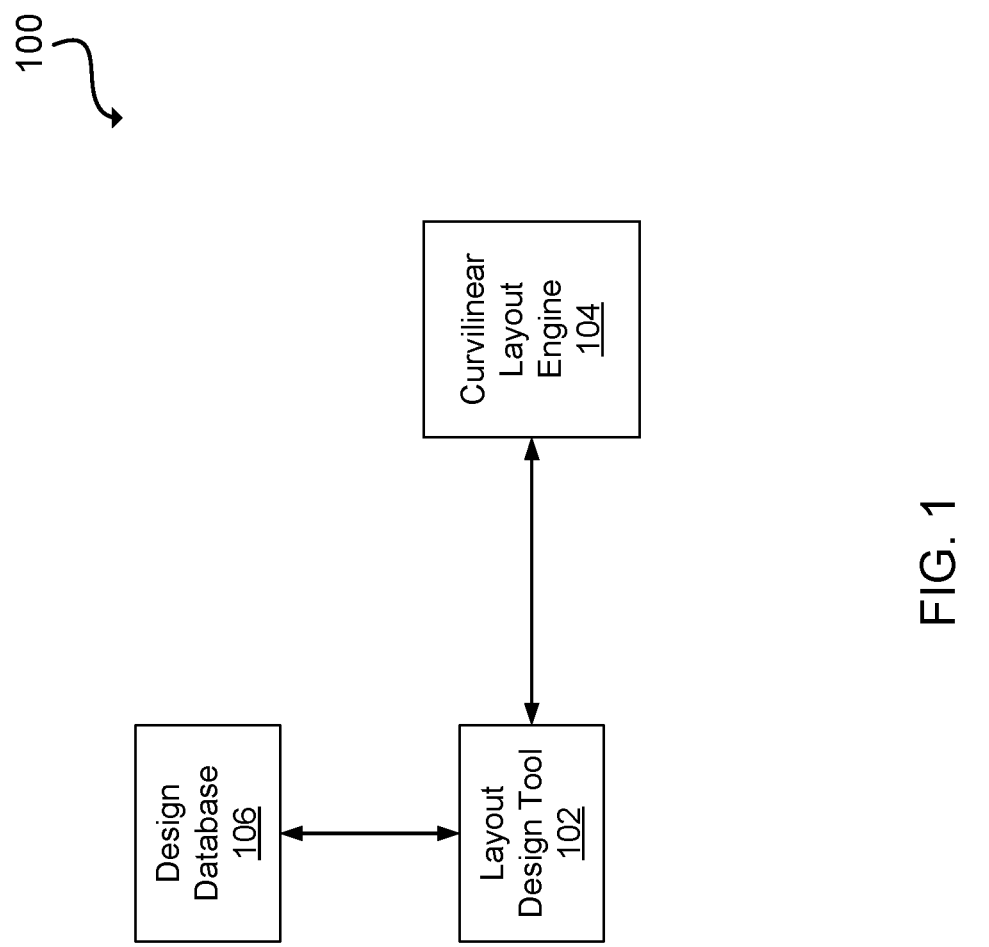
FIG. 1 depicts a block diagram of a layout creation system 100 for designing photonic integrated circuits (PICs) in accordance with some embodiments of the present disclosure.

Aspects of the present disclosure relate to the layout of photonic integrated circuits using fixed coordinate grids. In a photonic integrated circuit (also referred to as an integrated optical circuit), different photonic components are integrated onto a substrate. The photonic components can be either active or passive. Examples of photonic components include straight and bent waveguides, power splitters, optical amplifiers, optical modulators, filters, lasers and detectors. Photonic integrated circuits are fabricated using semiconductor fabrication techniques, such as lithography, etching and deposition. Examples of photonic integrated circuits include different types of lasers, receivers, modulators (e.g., Mach-Zehnder modulator) and also passive devices. Materials systems for photonic integrated circuits include indium phosphide, gallium arsenide, silicon, and silica, for example. Operating wavelengths commonly may include the visible and near infrared.

Photonic integrated circuits may also combine photonic components with electronic components. As photonic integrated circuits become increasingly complex and incorporate more electronics, layout tools used for the physical layout of electronic devices may be used or adapted to lay out these photonic integrated circuits.

However, existing layout design tools for electronic devices are typically based on a grid with fixed coordinates at some predefined spacing. Components are placed in the layout at positions that are snapped to the grid. For example, the layout of many electronic components is composed of rectangles at certain locations. The corners of the rectangles are forced to be located at the allowable fixed coordinates and cannot be located at intermediate locations between fixed coordinates. In addition, the rectangles may be rotated only in increments of 90 degrees or mirrored across the x- or y-axes, but rotations by arbitrary angles are not allowed.

This can cause problems for the layout of photonic components. The optical port of a photonic component typically is a face of a waveguide, which must be precisely abutted to the optical port of the adjoining photonic component in order to effectively couple the optical signal from one component to the next. It also is not unusual for photonic components to be rotated by arbitrary angles. As a result, the location of an optical port may not fall on the fixed coordinate grid, but the layout tool may snap its location to the nearest grid coordinates. If the adjoining optical port is then aligned to this snapped position, which is not the true position, this may introduce overlaps, gaps or jogs and may reduce coupling between the components when fabricated and cause the DRC (Design Rule Checking) failures that such layout errors may introduce.

In one aspect, when a request to place a photonic component within a layout of a photonic integrated circuit is received, the positioning of the component is represented by two sets of coordinates, which will be referred to as precise coordinates and snapped coordinates. The precise coordinates are more precise, whereas the snapped coordinates are consistent with the fixed coordinate grid. For example, the precise coordinates may define locations that are between the fixed coordinates of the grid. The precise coordinates provide the extra precision used in the layout of photonic components, such as for the alignment of optical ports. The snapped coordinates maintain compatibility with the layout tool or design database based on the fixed grid.

This allows existing layout tools and techniques to be more easily adapted for use with photonic components in addition to electronic components. It also reduces overall memory usage and data storage requirements, because precise coordinates are not used for all of the components in the layout. The positioning of electronic components may continue to be specified by only the snapped coordinates.

FIG. 1 depicts a block diagram of a layout creation system 100 for designing photonic integrated circuits (PICs). The system 100 includes a layout design tool 102, a curvilinear layout engine 104, and a design database 106. The layout design tool 102 provides a design environment for defining the physical layout of a photonic integrated circuit. The layout design tool 102 provides a display of the physical layout for design and editing. The layout design tool 102 may also provide for simulation management and analysis. The curvilinear layout engine 104 provides for component placement and verification for components within the layout. In some embodiments, the layout design tool 102 supports the physical layout of electronic devices that utilizes a grid with fixed coordinates at some predefined spacing. The layout of the photonic integrated circuit is not limited to photonic components and may include electrical circuits connected to photonic components.

The design database 106 stores the layouts of the photonic integrated circuits including information about the components in the layouts. A photonic component of a layout has a positioning within the layout that is represented in the design database 106 using precise coordinates and snapped coordinates. For example, the optical ports or other points of the components in the design database may be represented using precise coordinates to define the positioning of the components. The snapped coordinates have a precision consistent with the fixed coordinate grid of the layout design tool 102. The precise coordinates have a higher precision than the snapped coordinates and are used to facilitate the connecting of the components in the layout.

In some embodiments, the precise coordinates are at least 1000 times more precise than the snapped coordinates. For example, if the fixed coordinates of the grid and snapped coordinates use integer values, then the precise coordinates may use 3 or more decimal digits. In some embodiments, the precise coordinates have sufficient precision to avoid, in the vast majority of cases, any discontinuities, jogs or overlaps at the facet between the components, fully eliminating the alignment loss and avoiding DRC errors.

The layout design tool 102 provides a display of the layout using the fixed coordinate grid. The positioning of a component refers to location (e.g., x, y coordinates) and rotation of the component. Each component may be represented as a shape defined by multiple points, with the location of each point being defined by a snapped coordinate that is consistent with the fixed coordinate grid. The layout design tool 102 may not allow for points of a component being located off the fixed coordinate grid (e.g., by having points at higher precision than the fixed coordinate grid). As such, use of the fixed coordinate grid results in limitations on how components are placed in the displayed layout of the layout design tool 102.

Figure 2A:
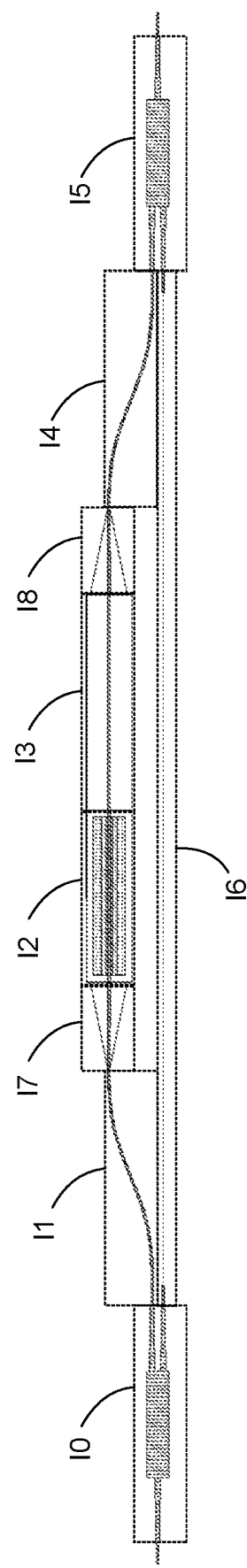
FIG. 2A depicts a screen shot of a physical layout of a photonic integrated circuit in accordance with some embodiments of the present disclosure.

FIG. 2A depicts a screen shot of a physical layout of a photonic integrated circuit. The photonic components are as follows: I0: optical splitter, I1: curved waveguide, I2: electro-optic modulator (applying electrical signal changes optical path length through the component), I3: straight waveguide, I4: curved waveguide, I5: optical combiner, I6: straight waveguide. The components are connected to form a Mach-Zehnder modulator. The electro-optic modulator I2 modulates the relative phase of the optical paths through the two arms. Thus, the optical signals from the two arms interfere constructively or destructively at the combiner I5. In the example of FIG. 2A, the electro-optic modulator I2 is an active element and includes optical ports for the optical signal but also electrical ports for electrical control signals. All of the other elements are passive. Transition components I7 and I8 bridge between different types of optical ports/waveguides. The components I1 through I7 are not rotated with respect to the fixed coordinate grid.

Figure 2B:
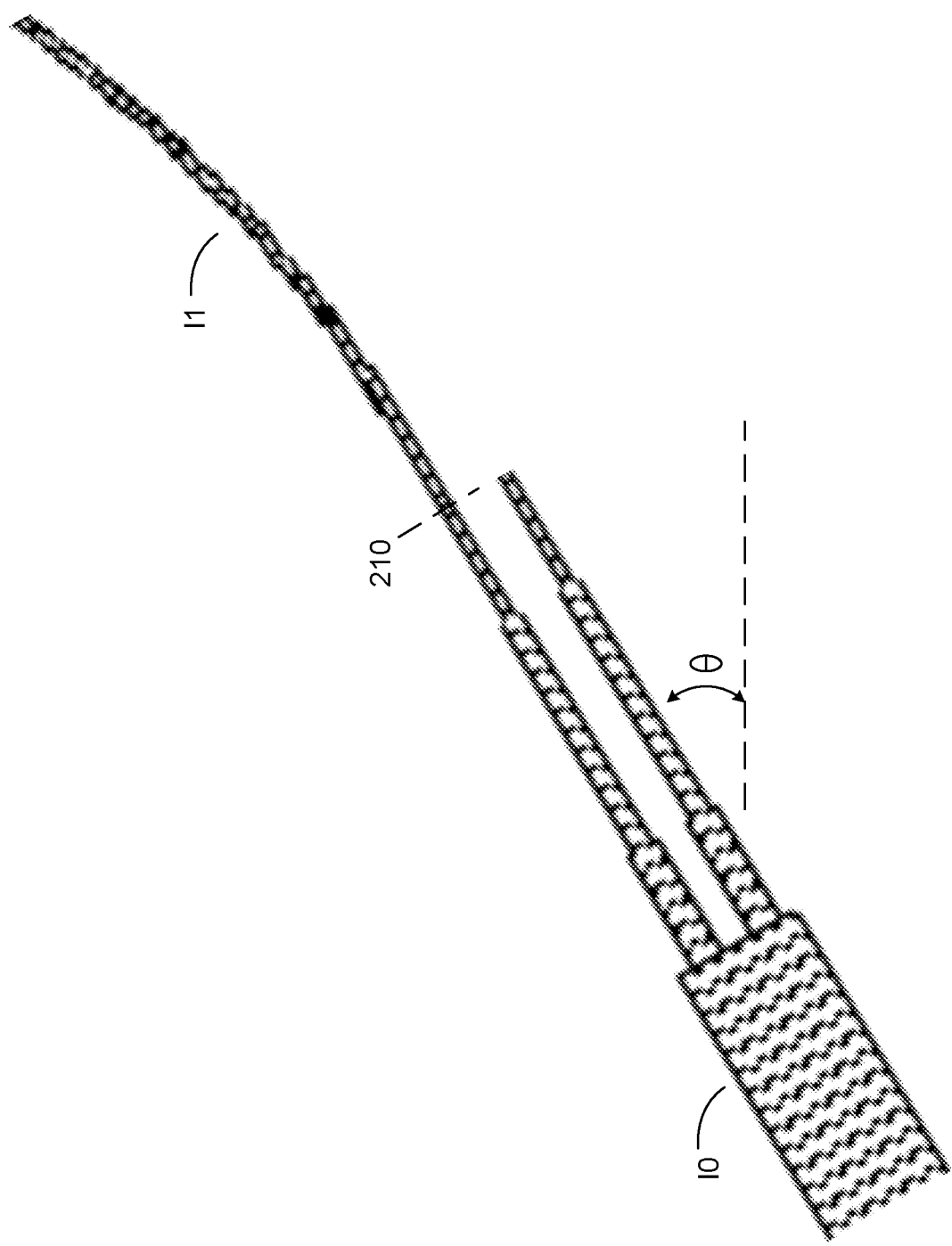
FIG. 2B depicts a screen shot of a physical layout of a photonic integrated circuit with rotated components in accordance with some embodiments of the present disclosure.

FIG. 2B depicts a screen shot of a physical layout of a photonic integrated circuit with rotated components. The components are represented by a shape that is rotated at an angle of rotation θ with respect to the orientation of the components in FIG. 2A. In this example, the angle of rotation θ is defined with respect to the x axis of a fixed coordinate grid including x and y axes. FIG. 2B shows a magnified view of the boundary 210 between ports of components I0 and I1. Because the components are rotated, their ports may not be located on the fixed grid. This may lead to misalignment of the ports. Although the components shown in FIG. 2B are each rotated by the same angle θ, different components within a layout may include different angles of rotation. The angle θ of each component can be various values and not necessarily a multiple of 90 degrees.

Figure 2C:
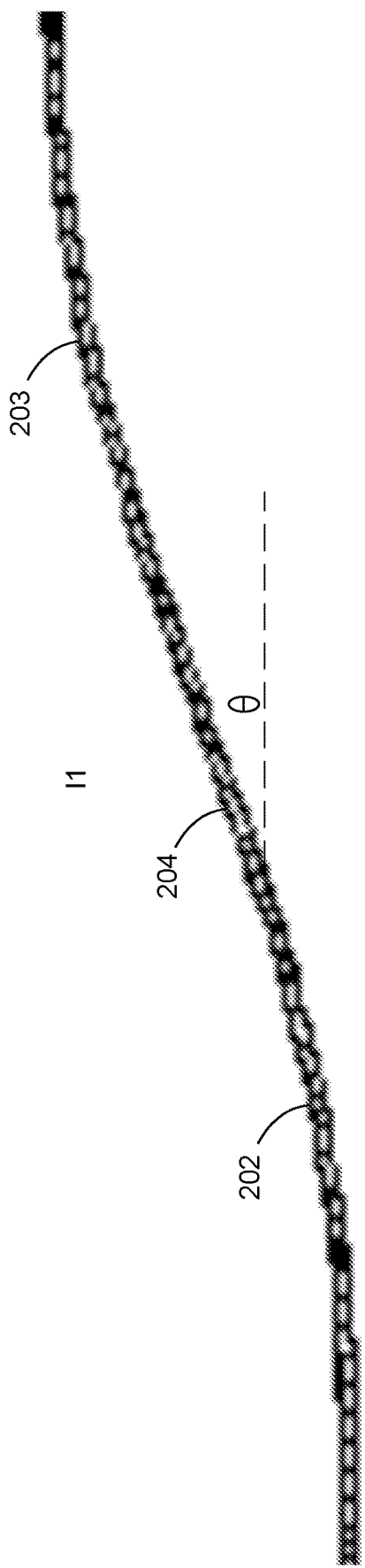
FIG. 2C depicts a screen shot of a physical layout of a photonic integrated circuit with a curvilinear shape in accordance with some embodiments of the present disclosure.

FIG. 2C depicts a screen shot of a physical layout of a photonic integrated circuit with a component having a curvilinear shape. The curved waveguide I1 has two internal curves 202, 203 and a straight section 204 having angle of rotation θ with respect to the fixed coordinate grid. These types of structures may be represented by polygons rotated at arbitrary angles. The resulting coordinates may not be located on the fixed grid, which may lead to misalignments or other inaccuracies in layout.

Figure 2D:
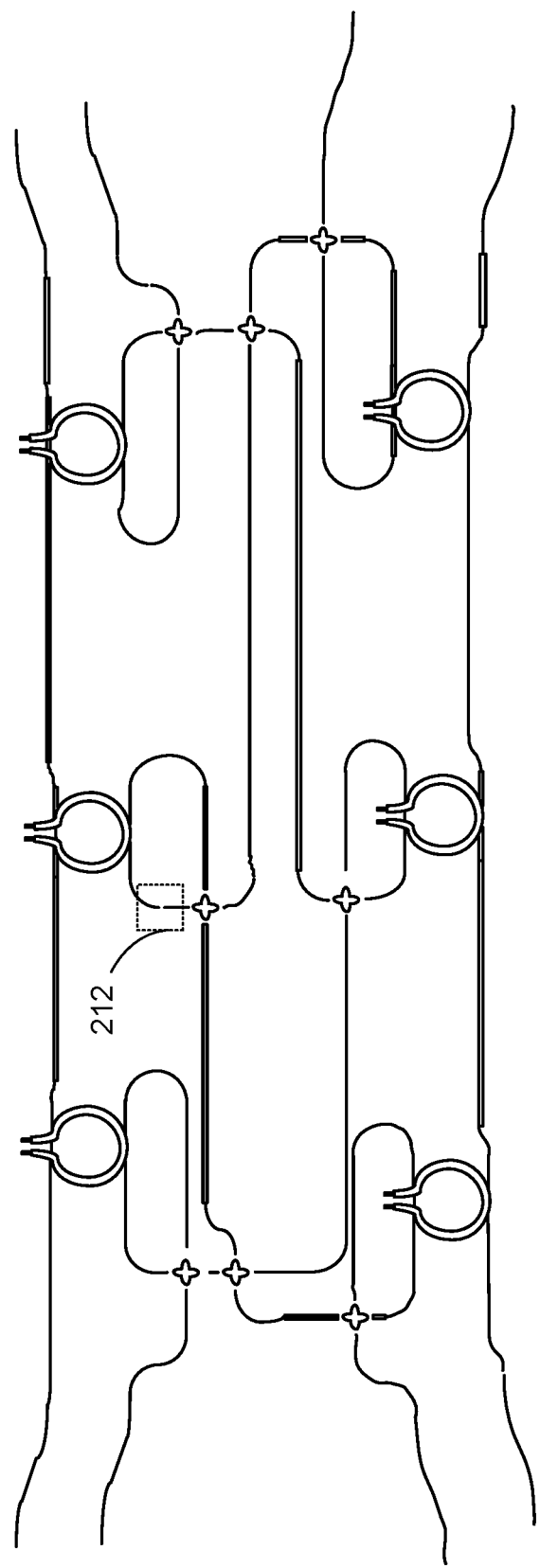
FIG. 2D depicts a screen shot of a physical layout of a photonic integrated circuit in accordance with some embodiments of the present disclosure.
Figure 2E:
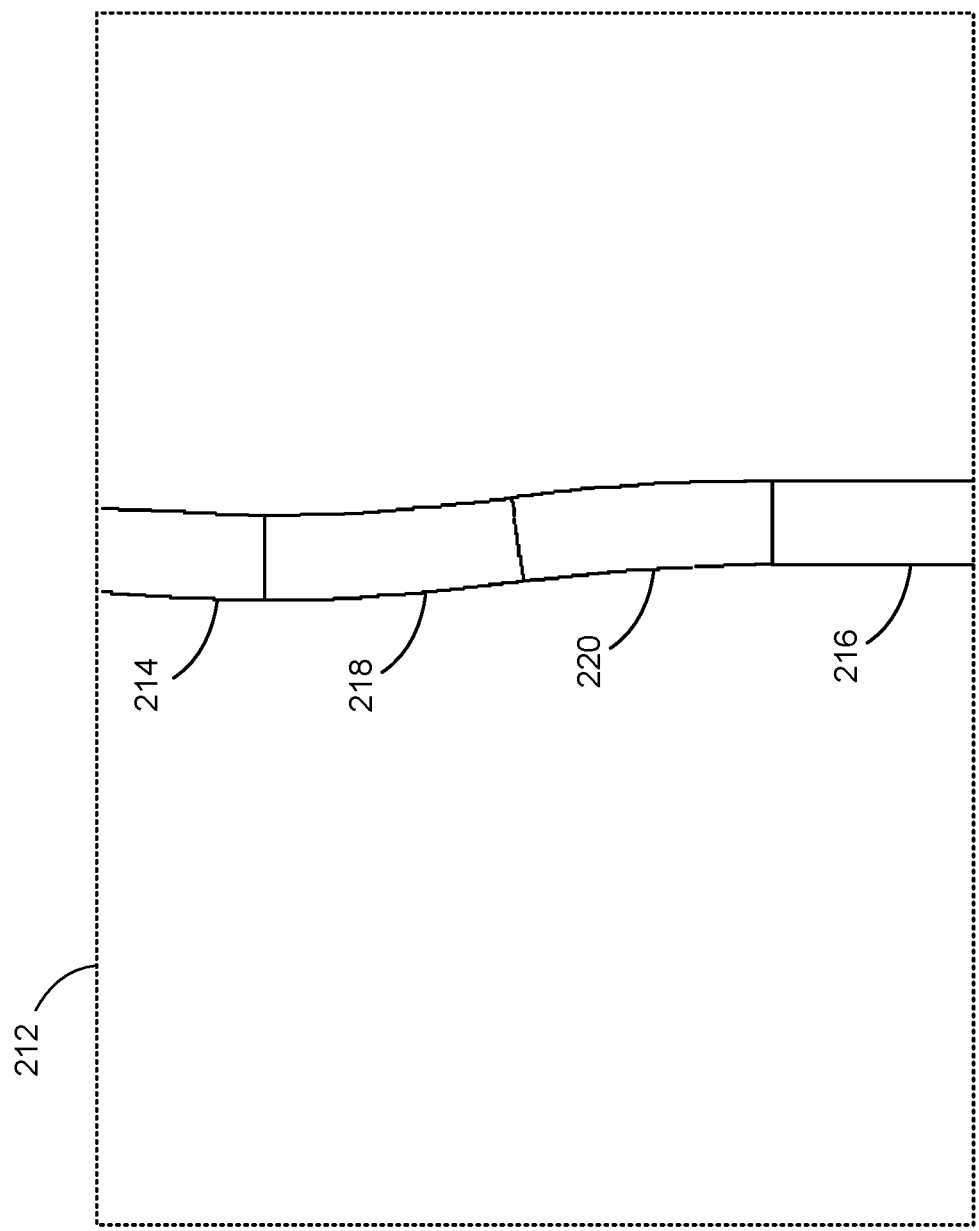
FIG. 2E depicts a close view of an interconnect of the photonic integrated circuit of FIG. 2D in accordance with some embodiments of the present disclosure.

FIG. 2D depicts a screen shot of a physical layout of a photonic integrated circuit. The photonic integrated circuit is a Benes switch including interconnected components. One of the interconnects is at region 212. FIG. 2E depicts a close view of the region 212 including an interconnect of the photonic integrated circuit of FIG. 2D. To compensate for a slight offset of components 214 and 216, two components 218 and 220 (e.g., optical connectors, such as waveguides) that connect the components 214 and 216 include arcs. These arcs may be represented by polygons rotated at arbitrary angles. The resulting coordinates may not be located on the fixed grid, which may lead to misalignments or other inaccuracies in layout.

To place a component in the layout, the layout design tool 102 requests a positioning of the component to the curvilinear layout engine 104. In response, the curvilinear layout engine 104 generates the positioning of the component in snapped coordinates that are consistent with the fixed coordinate grid of the layout design tool 102. The layout design tool 102 then displays the component in the layout based on the fixed coordinate grid. The components requested can include a building block request or a connector request.

The building block request is used to place a new component in the layout or change the positioning of an existing component in the layout. The specification for the building block request may indicate which component to place, along with parameter values of the component. The parameter values may include values that define the desired positioning of the component. For example, the parameter values may define the location and the angle of rotation of the component. The location may be defined by a desired optical port location of the component.

The curvilinear layout engine 104 calculates precise and snapped coordinates for the component. To calculate the precise coordinates for the points the component, the curvilinear layout engine 104 operates in a "full precision" mode. That is, the curvilinear layout engine 104 works with a higher precision than the precision of the fixed coordinate grid. The curvilinear layout engine 104 may generate shapes with precise coordinates following mathematical curve descriptions. Shapes may be initially generated by the curvilinear layout engine 104 with an error specification (e.g., used to satisfy technology error tolerances) for the mathematical curve description. The points of a shape may include points along the edges of the shape. Some of the points along the edges may be optical ports. Depending on the desired location and rotation of the component, which can be angles that are not multiples of 90 degrees, the precise coordinates of some or all points of the component may not be on the fixed coordinate grid.

To calculate the snapped coordinates for the component that are consistent with the fixed coordinate grid, the curvilinear layout engine 104 may snap each of the precise coordinates of the points of the shape to a respective fixed coordinate of the grid. The curvilinear layout engine 104, which is aware of the grid settings of the layout design tool 102 including the fixed coordinates, calculates the snapped coordinates using an iterated snap rounding where original segments of points are substituted by polygonal chain, where each point is at least ½ a unit distance from any non-incident edge.

The curvilinear layout engine 104 returns the snapped coordinates for the positioning of component to the layout design tool 102 in response to the building block request, and the layout design tool 102 displays the component in the layout using the snapped coordinates. The curvilinear layout engine 104 also returns the precise coordinates for the positioning of the component, which may include but is not necessarily limited to the precise coordinates of an optical port, to the layout design tool 102. The layout design tool 102 may store the precise and snapped coordinates of the component in the design database 106, or the curvilinear layout engine 104 may directly store the precise and snapped coordinates in the design database 106.

The connector request is used to place a component in the layout that is to be connected to a previously placed component. Here, an optical port of the component to be placed is aligned with an optical port of the previously placed component in the layout and used as an anchor point for the connection. The curvilinear layout engine 104 calculates precise and snapped coordinates for the component in response to the connector request.

To calculate the positioning of the precise coordinates of the component to be placed, the curvilinear layout engine 104 uses the precise coordinates of the previously placed component. The precise coordinates of the previously placed component may be received from the layout design tool 102 (e.g., in connection with the request specification) or retrieved from the design database 106 by the curvilinear layout engine 104.

The curvilinear layout engine 104 calculates the precise coordinates for an optical port of the component to be placed based on the parameter values of the component and the precise coordinates of an optical port of the previously placed component. The precise coordinates ensure the alignment and connection of optical ports to each other. Based on the alignment of optical ports, the component to be placed is rotated so that an edge including the optical port of the component to be placed abuts an edge of the optical port of the previously placed component. The precise coordinates define a positioning of the component that results in the edge the component abutting the precise coordinates of the edge of the previously placed component without an overlap or a gap.

The curvilinear layout engine 104 calculates the snapped coordinates for the component to be placed that are consistent with the fixed coordinate grid using the precise coordinates, such as by snapping the precise coordinates of the points of the shape to the fixed coordinate grid.

The curvilinear layout engine 104 returns the snapped coordinates for the positioning of component to the layout design tool 102 in response to the connector request, and the layout design tool 102 displays the component in the layout using the snapped coordinates. Based on the snapped coordinates, the edge of the optical port of the component also abuts the edge of the optical port of the previously placed component without an overlap or a gap in the layout displayed by the layout design tool 102. The curvilinear layout engine 104 provides the positioning of the component as represented utilizing both the precise coordinates and the snapped coordinates to the layout design tool 102 for storing in the design database 106, or the curvilinear layout engine 104 may store the precise and snapped coordinates in the design database 106. The precise coordinates of optical ports may be used for subsequent connector requests to connect additional components.

Figure 3A:
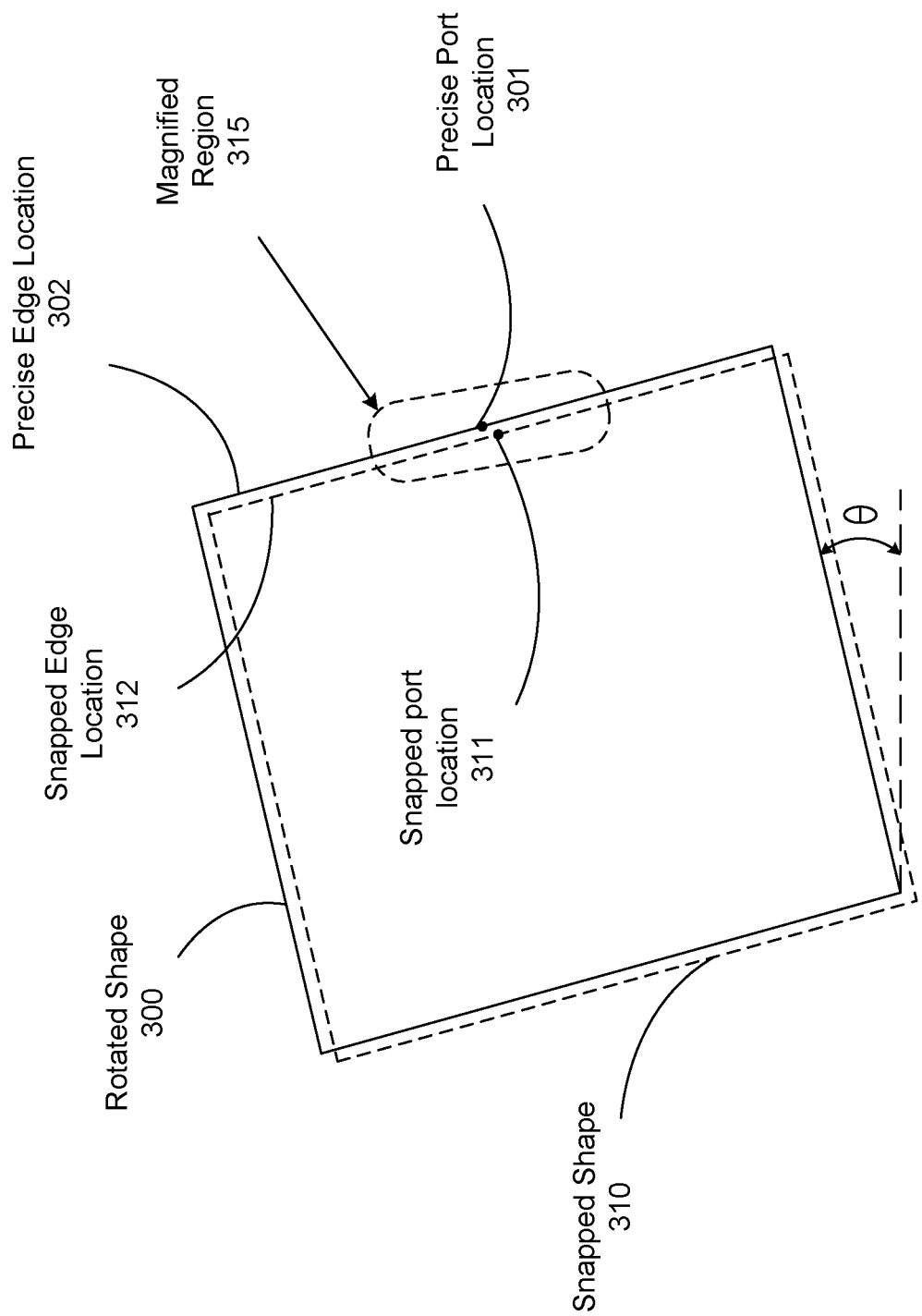
FIG. 3A depicts a diagram of a rotated shape and a snapped shape for a component in accordance with some embodiments of the present disclosure.

FIG. 3A depicts a diagram of a rotated shape 300 and a snapped shape 310 for a component. The component may be represented in the layout by a parameterized cell (PCell) and parameters for the parameterized cell. The positioning of the rotated shape 300 in the layout is defined by the precise coordinates of the component and the positioning of the snapped shape 310 is defined by the snapped coordinates of the component. In response to a request received from the layout design tool 102 (e.g., a block request), the curvilinear layout engine 104 generates the rotated shape 300 based on parameter values including an optical port location and an angle of rotation θ. By rotating the shape 300 by the angle θ, the resulting specified port location 301 has precise coordinates that may not be located on the fixed coordinates of the grid of the layout design tool 102.

If precise coordinates are not used, then layout errors can occur as components are connected to each other at different (e.g., arbitrary) orientations. One type of error is when the edge of a snapped shape does not align or coincide with the optical port location of a previously placed component specified by the layout design tool 102 in a connector request. When the curvilinear layout engine 104 snaps a shape that has been rotated by an angle that is not a multiple of 90 degrees, it is likely that the edge of the snapped shape does not coincide with the specified port location of the previously placed component.

The snapped shape 310 is an example of a result when the curvilinear layout engine 104 snaps the rotated shape 300 to the grid of the layout design tool 102. The specified precise port location 301 of the rotated shape 300, as defined by precise coordinates, is offset to a snapped port location 311 for the snapped shape 210, as defined by the snapped coordinates. The edge location 302 of the rotated shape 300, as defined by precise coordinates for points of the edge, is similarly snapped to a snapped edge location 312 for the snapped shape 310, as defined by snapped coordinates for the points of the edge.

Figure 3B:
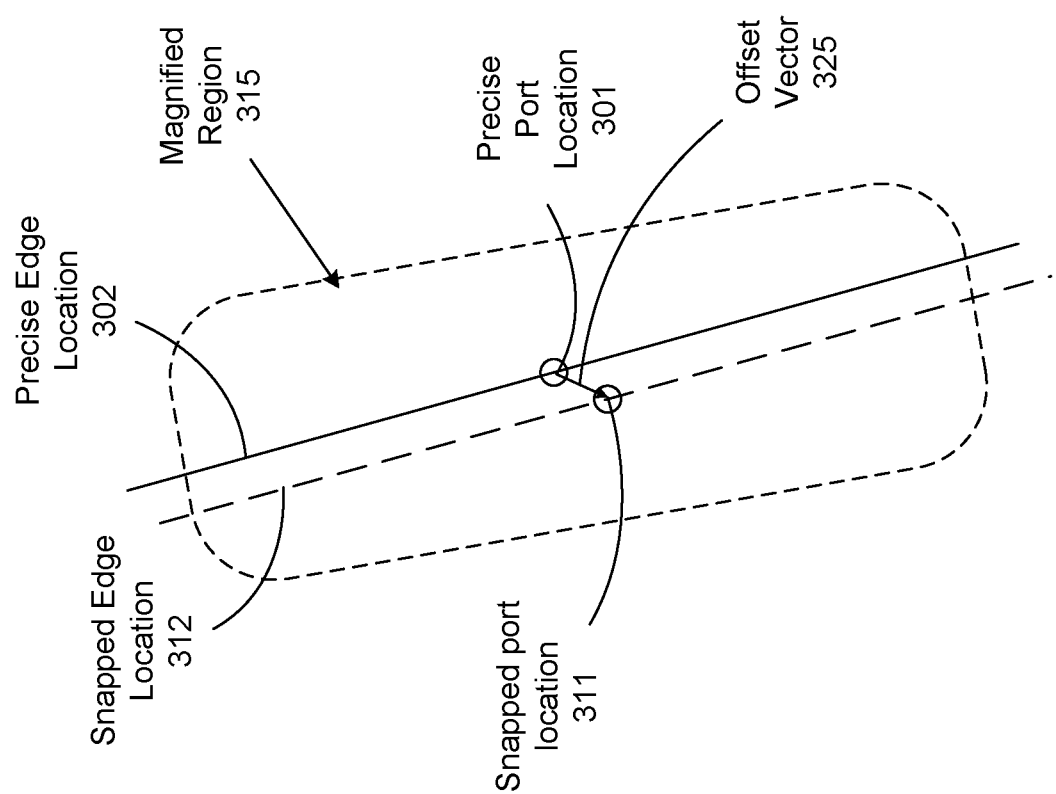
FIG. 3B depicts a diagram of a magnified region of the component of FIG. 3A near a precise port location and a snapped point location in accordance with some embodiments of the present disclosure.

FIG. 3B depicts a diagram of a magnified region 315 of the component near the precise port location 301 and the snapped point location 311. An offset vector 325 is defined between the precise port location 301 and the snapped point location 311.

In response to a request specification, the curvilinear layout engine 104 returns the snapped shape 310, along with the snapped port location 311 to the layout design tool 102. If the precise coordinate is not used here, the snapped port location 311 reported to the layout design tool 102 does not correspond with the precise port location 301 of the rotated shape 300. When the layout design tool 102 edits the layout of the shape, abuts instances of shapes together, or updates the optical connectors associated with the shape, the requests sent by the layout design tool 102 to the curvilinear layout engine 104 would only be able to specify the snapped port location 311 that does not correspond with the precise port location 301. Because the layout design tool 102 uses the snapped port location 311 as the anchor location for other shapes that connect to the rotated shape 300, there may be a gap between abutted shapes or an overlap of abutted shapes resulting from the difference between the snapped port location 311 and the precise port location 301, as defined by the offset vector 325.

Figure 4:
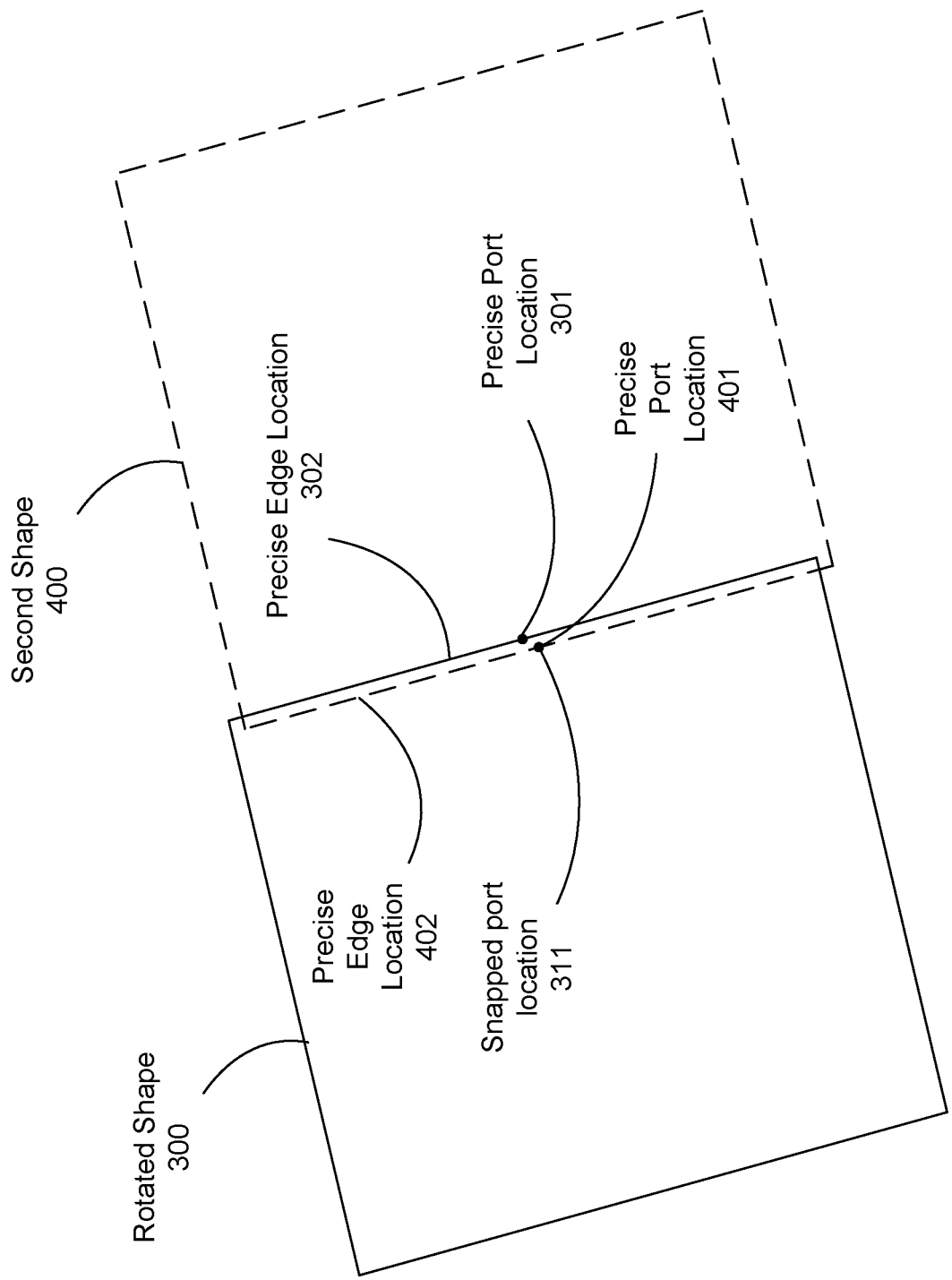
FIG. 4 depicts a diagram of shapes of connected components with an undesirable overlap in accordance with some embodiments of the present disclosure.

For example, as illustrated in FIG. 4, the layout design tool 102 transmits a connector request to the curvilinear layout engine 104 that specifies a second shape 400 of a component (e.g., an optical connector, such as a waveguide) to be optically connected to and abutted to the rotated shape 300. This request includes parameter values that are used to define the second shape 400, including the snapped port location 311 of an optical port of the rotated shape 300 that is to be connected to an optical port of the second shape 400. This snapped port location 311 in the request does not correspond with the precise port location 301. The curvilinear layout engine 104 generates the second shape 400 in response to the received request, where second shape 400 has a precise port location 401 that is aligned with the snapped port location 311. As a result, the precise edge location 402 of second shape 400 undesirably overlaps with the precise edge location 302 of rotated shape 300. When the second shape 400 is snapped to the grid, the snapped edge location of the second shape 400 fails to abut the snapped edge location 311 of the snapped shape 310 and the snapped port location of the second shape 400 is not aligned with the snapped port location 311 of the snapped shape 310.

As such, the precise port location 301 is stored (e.g., in the design database 106) to ensure that the layout design tool 102 does not lose information regarding the precise port location 301 as a result of the grid snapping. The stored precise coordinates of the optical port allow the layout creation system 100 to compensate for the offset vector 325 between the precise port location 301 and the snapped port location 311 of the previously placed component.

For example, the layout design tool 102 is connected to the design database 106 to access both the precise port location 301 as defined by the precise coordinates and the snapped port location 311 as defined by the snapped coordinates. The curvilinear layout engine 104 may return the precise and snapped coordinates to the layout design tool 102 in the response to the request that is used to place the component, and the curvilinear layout engine 104 may store the precise and snapped coordinates in the design database 106. For a subsequent connector request to place another component that connects to the previously placed component, the layout design tool 102 retrieves the precise port location 301 and the snapped port location 311 of the previously placed component from the design database 106, calculates the offset vector 325 between the precise port location 301 and snapped port location 311, and sends the offset vector 325 along with the snapped port location 311 in the connector request to the curvilinear layout engine 104. In one embodiment, the precise coordinates and the snapped coordinates of the optical port are each stored in a port object in the data store 106 as a parameter value of the snapped shape 310. As a result, the layout design tool 102 has access to both the precise port location 301 and the snapped port location 311 of the optical port. The design database 106 may store the precise coordinates of optical ports only or may also store the precise coordinates of other points of placed components. The precise coordinates may be represented in the design database 106 in various ways. In some embodiments, the precise coordinates are represented in the design database 106 by the offset vector between the precise and snapped coordinates (e.g., rather than the x, y values of the precise coordinates).

Figure 5:
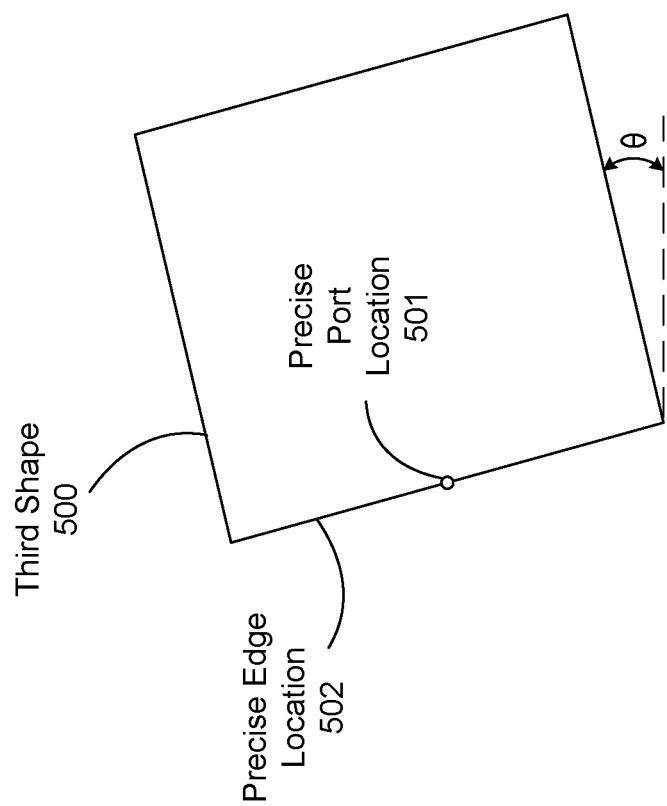
FIG. 5 depicts a diagram of a rotated shape of a component in in accordance with some embodiments of the present disclosure.

With reference to FIG. 5, when the layout design tool 102 transmits a connector request to the curvilinear layout engine 104 that specifies a third shape 500 (which may be a PCell or an optical connector) to be connected the rotated shape 300 of FIG. 3A, the layout design tool 102 includes the offset vector 325 in addition to parameter values used to define the third shape 500. The parameter values of the third shape 500 may include information about the previously placed component that is to be connected to the third shape 500, such as the snapped port location 311 of the rotated shape 300, and an angle of rotation θ for the third shape 500.

The curvilinear layout engine 104 receives the connector request from the layout design tool 102, which includes the snapped port location 311 and the offset vector 325. In response, the curvilinear layout engine 104 calculates the precise port location 301 of the rotated shape 300 using the offset vector 325 and the snapped port location 311, such as by moving the snapped port location 311 by an offset that is the inverse of the offset vector 325 to the precise port location 301. Note that if either of the shapes 300 or 500 represents a PCell, then any design database transformations associated with the PCell(s) must be accounted for when determining the offset vector 325. For example, a transformation may be applied after the shapes have been generated, and, for example, does not change any port properties. Therefore, having a shape rotated 30 degrees, will have one of the ports set at 30 degrees. The same object can have a transform applied to it (e.g. R90, which applies a rotation of 90 degrees). The port still will have the property to 30 degrees, but in the global design coordinates, the effective angle will be 90+30=120 degrees.

Figure 6:
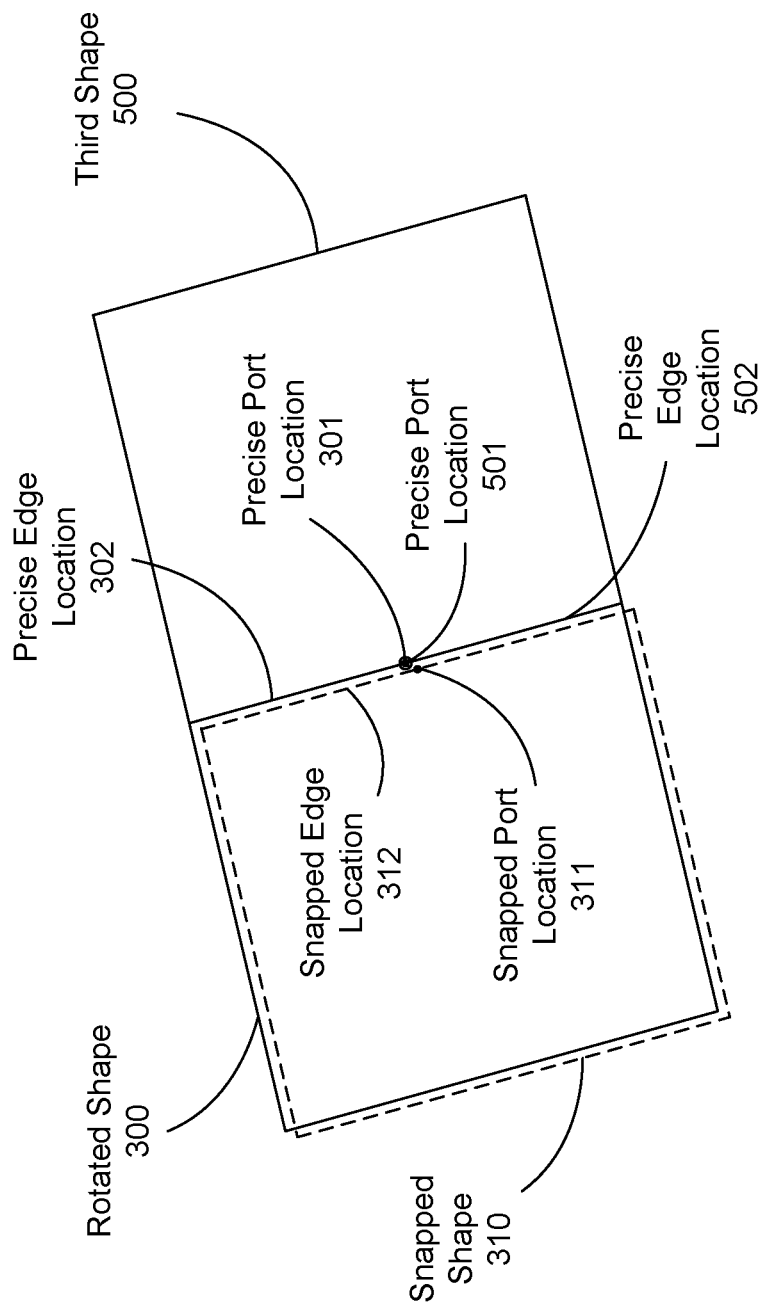
FIG. 6 depicts a diagram of the rotated shape of FIG. 3A connected with the rotated shape of FIG. 5 using precise coordinates in accordance with some embodiments of the present disclosure.

The curvilinear layout engine 104 uses the precise port location 301 of the rotated shape 300 as the anchor location for calculating the precise coordinates of the third shape 500. As shown in FIG. 6, the curvilinear layout engine 104 determines a precise port location 501 along an edge located at a precise edge location 502 that is aligned with the precise port location 301. The precise edge location 502 of the third shape 500 is placed to abut the precise edge location 302 of rotated shape 300. This may be achieved by rotating the third shape 500 with the precise port location 501 aligned to the precise port location 301.

Figure 7:
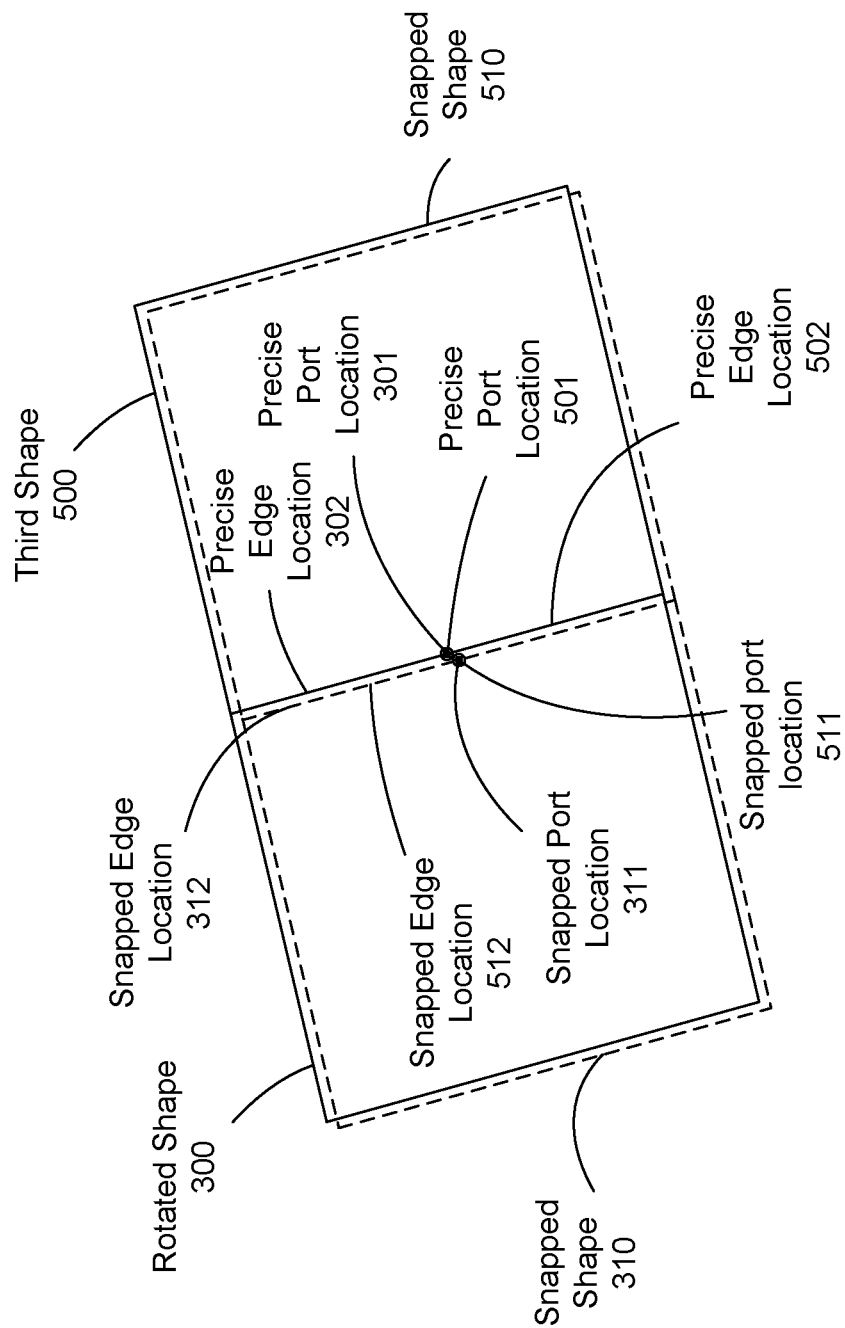
FIG. 7 depicts a diagram of the snapped shape of FIG. 3A connected with a snapped shape for the rotated shape of FIG. 5 using snapped coordinates in accordance with some embodiments of the present disclosure.

As shown in FIG. 7, the curvilinear layout engine 104 then snaps the third shape 500 to the fixed coordinate grid of the layout design tool 102, in the same manner used to produce the snapped shape 310 from the rotated shape 300 (e.g., by applying the same iterated snap rounding). Snapping the third shape 500 to the fixed coordinate grid may include calculating snapped coordinates using the precise coordinates. The snapped third shape 510, along with corresponding snapped port location 511 and snapped edge location 512, have a precision consistent with the fixed coordinate grid of the layout design tool 102.

As a result, the snapped edge location 512 of snapped shape 510 abuts the snapped edge location 312 of snapped shape 310, and the snapped port location 511 of snapped shape 510 is aligned with the snapped port location 311 of snapped shape 310. The components represented by the snapped shapes 310 and 510 are connected without gaps or overlaps. To complete the response to the connector request, the curvilinear layout engine 104 returns the positioning of the snapped shape 510 to the layout design tool 102, including the snapped coordinates used to display the snapped shape 510 and precise coordinates used to connect other shapes to the snapped shape 510. The curvilinear layout engine 104 stores the precise coordinates of the component in the design database 106 for use in subsequent connector requests.

Figure 8:
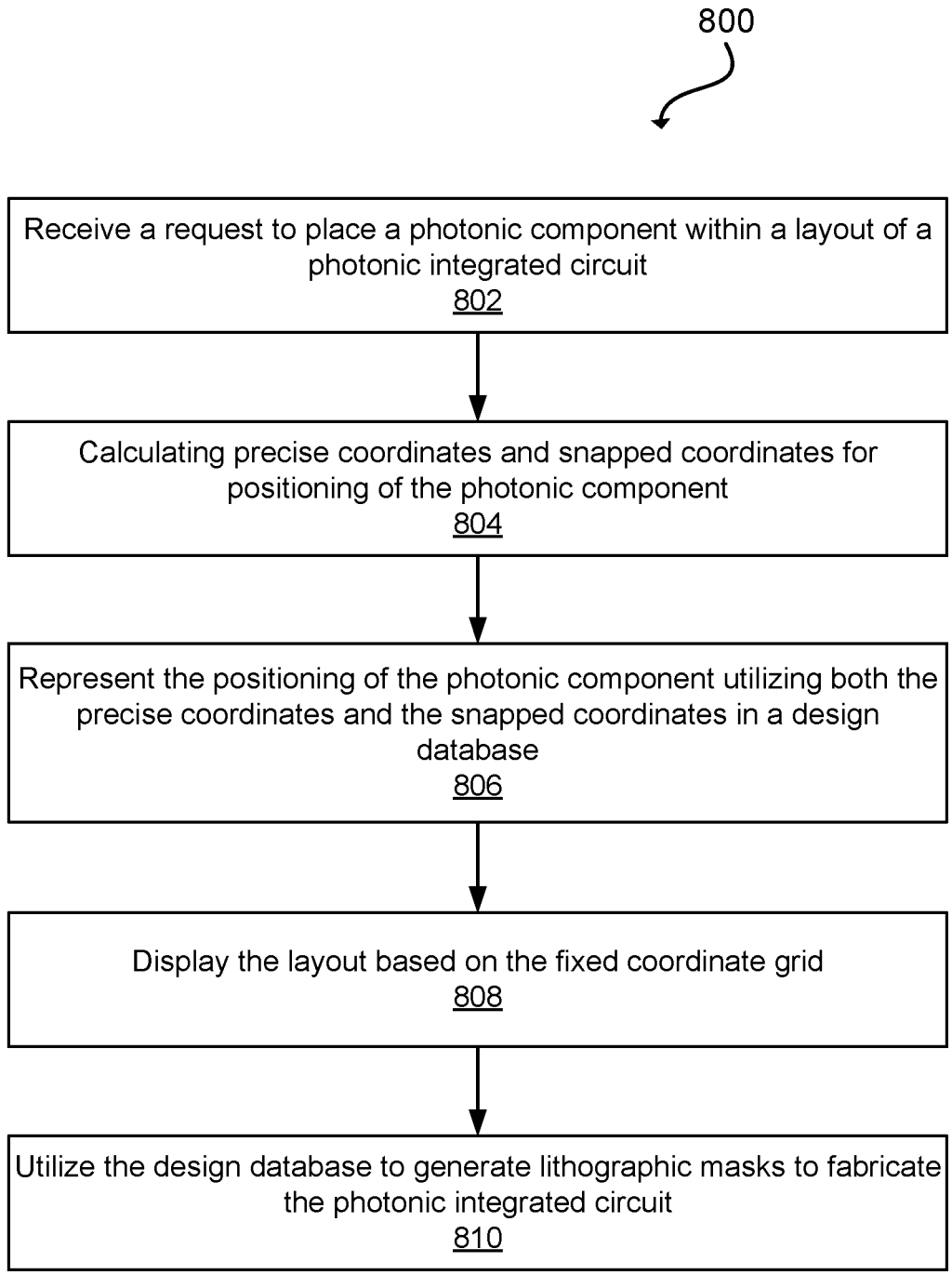
FIG. 8 depicts a flowchart of a process for generating a layout of a photonic integrated circuit in accordance with some embodiments of the present disclosure.

FIG. 8 depicts a flowchart of a process 800 for generating a layout of a photonic integrated circuit. The process 800 is discussed as being performed by the layout creation system 100, although other types of computing systems and devices may be used. The process 800 may include a greater or fewer number of steps, and steps may be performed in different orders.

The curvilinear layout engine 104 receives 802 a request from the layout design tool 102 to place a photonic component within a layout of a photonic integrated circuit. The photonic component may be represented by a parameterized cell and parameters for the parameterized cell. In another example, the photonic component may be an optical connector. The request may be a building block request to add a new component, change the positioning of an existing component, or the request may be a connector request to align the component to a previously placed component. The positionings of components within the layout are represented in a design database 106 utilizing a grid with fixed coordinates.

The curvilinear layout engine 104 calculates 804 precise coordinates and snapped coordinates for positioning of the photonic component. The snapped coordinates have a precision consistent with the fixed coordinate grid. The precise coordinates have a higher precision than the snapped coordinates.

To add a new component or change the positioning of an existing component, the request may include a location and a rotation for the component. The location may be defined by the location of an optical port, or the location of some other point of the component. The curvilinear layout engine 104 calculates the precise coordinates using the location and the rotation of the component. The component may be rotated by an angle that is not a multiple of 90 degrees in its positioning. The curvilinear layout engine calculates the snapped coordinates using the precise coordinates, such as by applying an iterated snap rounding.

To connect the component to a previously placed component, the request may include precise coordinates of an optical port of the previously placed component that is to be aligned to an optical port of the component that is to be placed. The precise coordinates in the request may be represented by snapped coordinates and an offset between the snapped coordinates and the precise coordinates. The precise coordinates of the previously placed component may be stored in the design database 106 and retrieved from the design database 106 by the layout design tool 102 to generate the connector request. In the design database 106, the precise coordinates for placed components may represented as offsets from the snapped coordinates. The curvilinear layout engine 104 calculates the precise coordinates by aligning the optical port of the component with the precise coordinates of the optical port of the previously placed component, and rotating the component such that the edge including the optical port of the component abuts an edge of the optical port of the previously placed component. The component may be rotated by an angle that is not a multiple of 90 degrees in its positioning. Based on the precise coordinates, the edge of the optical port of the component abuts an edge of the optical port of the previously placed component without an overlap or a gap. Based on the precise coordinates, the edge of the optical port of the component has a same orientation (e.g., angle of rotation) as the edge of the optical port of the previously placed component. The curvilinear layout engine calculates the snapped coordinates using the precise coordinates, such as by applying an iterated snap rounding.

In the design database 106, the positioning of the photonic component is represented 806 utilizing both the precise coordinates and the snapped coordinates. For example, the curvilinear layout engine 104 returns the calculated precise coordinates and snapped coordinates of the component to the layout design tool 102. The layout design tool 102 stores the precise coordinates and snapped coordinates of the component in the design database 106. In the design database 106, the precise coordinates of components may be represented as offsets from the snapped coordinates of the components. In some embodiments, the component is represented by an object in the design database 106, and the precise coordinates of the component are stored as part of the object.

The layout design tool 102 displays 808 the layout based on the fixed coordinate grid. For example, each component that is placed in the layout is displayed using snapped coordinates of the component. In some embodiments, the layout design tool 102 is used for the physical layout of electronic devices based on a grid with fixed coordinates at some predefined spacing, and thus the points of the components are snapped to the grid at snapped coordinates. In some embodiments, the photonic integrated circuit includes electrical circuits. The layout of the photonic integrated circuits includes layout of the electrical circuits aligned to the fixed coordinate grid. Steps 802 through 808 may be repeated to place additional components in the layout of the photonic integrated circuit.

The design database 106 is utilized 810 to generate lithographic masks to fabricate the photonic integrated circuit. For example, the physical layout of the photonic integrated circuit is used to generate mask-level descriptions that are used to manufacture a set of lithographic masks. The lithographic masks may be generated using the snapped coordinates.

Figure 9:
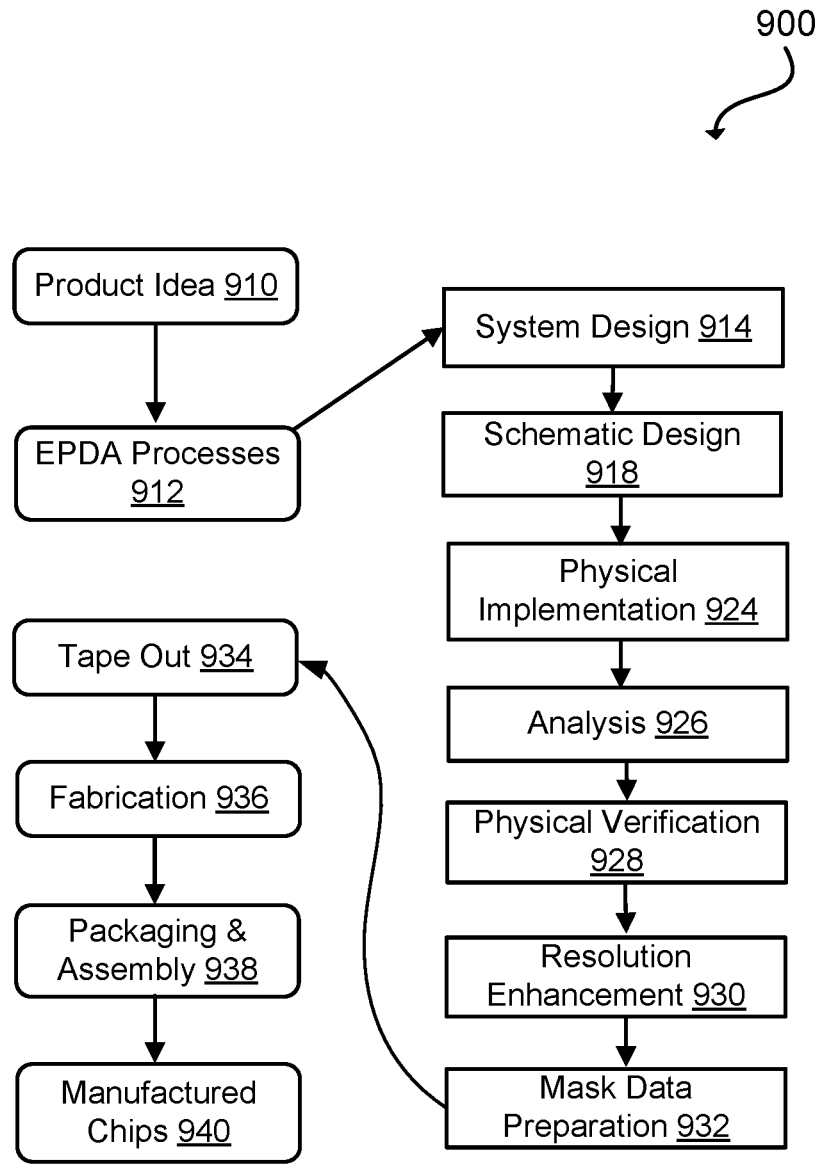
FIG. 9 depicts a flowchart of various processes used during the design and manufacture of a photonic integrated circuit in accordance with some embodiments of the present disclosure.

FIG. 9 illustrates an example set of processes 900 used during the design, verification, and fabrication of a photonic integrated circuit (PIC) to transform and verify design data and instructions that represent the PIC. Each of these processes can be structured and enabled as multiple modules or operations. The term 'EPDA' signifies the term 'Electronic Photonic Design Automation.' These processes start with the creation of a product idea 910 with information supplied by a designer, information which is transformed to create an article of manufacture that uses a set of EPDA processes 912. When the design is finalized, the design is taped-out 934, which is when artwork (e.g., geometric patterns) for the PIC is sent to a fabrication facility to manufacture the mask set, which is then used to manufacture the PIC. After tape-out, a die is fabricated 936 and packaging and assembly processes 938 are performed to produce the finished photonic integrated circuit 940.

Specifications may range from lower-level material and physical layouts to higher-level descriptions. Higher level descriptions can be transformed to lower level descriptions: product specifications to schematic to physical layout to mask-level descriptions, for example. Each lower abstraction level that is a less abstract description adds more useful detail into the design description, for example, more details for the modules that include the description. The lower levels of abstraction that are less abstract descriptions can be generated by a computer, derived from a design database, or created by another design automation process. Descriptions at each level of abstraction are enabled for use by the corresponding tools of that layer. A design process may use a sequence depicted in FIG. 9. The processes described may be enabled by EPDA products (or tools), although the steps in FIG. 9 focus on the photonic design steps.

During system design 914, functionality of a PIC to be manufactured is specified. The design may be optimized for desired characteristics such as power consumption, performance, area (physical and/or lines of code), and reduction of costs, etc. Partitioning of the design into different types of modules or components can occur at this stage.

During schematic design 918, higher level descriptions may be transformed to a netlist of components. In some embodiments, a netlist may be a graph structure where edges of the graph structure represent components of the PIC and where the nodes of the graph structure represent how the components are interconnected.

During layout or physical implementation 924, physical placement (positioning of circuit components such as described above) and routing (connection of the circuit components by waveguides) occurs.

During analysis 926, the circuit function is verified at the physical layout level, which permits refinement of the schematic and/or layout designs. During physical verification 928, the physical layout design is checked to ensure that manufacturing constraints are correct. During resolution enhancement 930, the geometry of the layout may be transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished PICs.

A storage subsystem of a computer system (such as computer system 1000 of FIG. 10) may be used to store the programs and data structures that are used by some or all of the EPDA products described herein, and products used for development of cells for the library and for physical and logical design that use the library.

Figure 10:
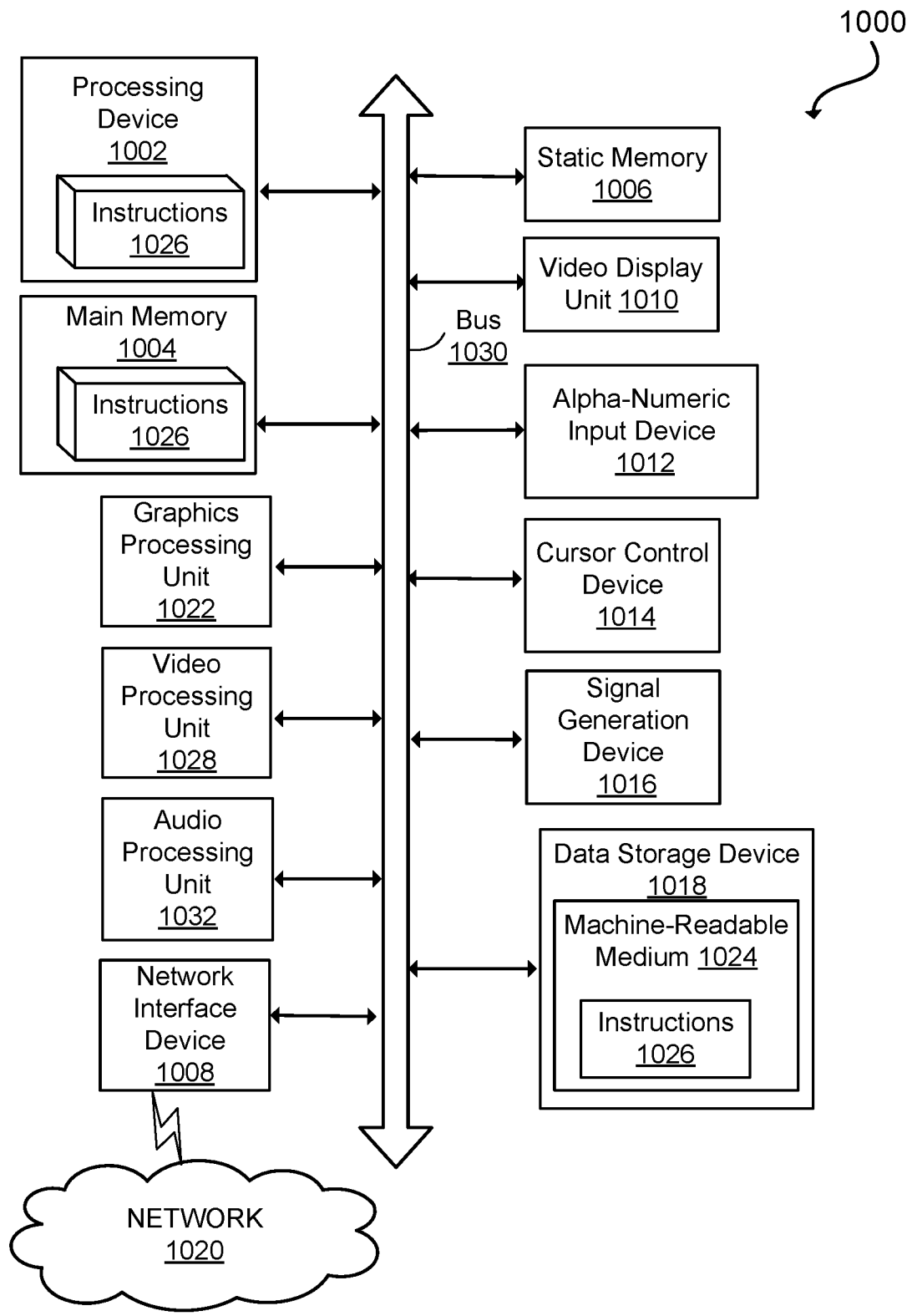
FIG. 10 depicts an abstract diagram of an example computer system in which embodiments of the present disclosure may operate.

FIG. 10 illustrates an example machine of a computer system 1000 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The invention claimed is:

1. A method comprising:
receiving a request to place a first photonic component within a layout of a photonic integrated circuit, wherein positionings of components within the layout are represented in a design database utilizing a grid with fixed coordinates;
calculating precise coordinates and snapped coordinates for positioning of the first photonic component, wherein the snapped coordinates have a precision consistent with the fixed coordinate grid and the precise coordinates have a higher precision than the snapped coordinates, and calculating the precise coordinates comprises:
a layout design processing device transmitting to a curvilinear layout processing device the request to place the first photonic component, wherein the layout design processing device displays the layout based on the fixed coordinate grid; and
the layout design processing device receiving from the curvilinear layout processing device the precise coordinates for the first photonic component;
in the design database, representing the positioning of the first photonic component utilizing both the precise coordinates and the snapped coordinates;
using the snapped coordinates from the design database to display the layout of the photonic integrated circuit on the layout design processing device; and
using the precise coordinates from the design database in a process to fabricate the photonic integrated circuit.

2. The method of claim 1 wherein the request to place the first photonic component comprises a request to align a first optical port of the first photonic component to a second optical port of a previously placed second photonic component in the layout; and calculating the precise coordinates for positioning of the first photonic component is based on the precise coordinates representing the positioning of the second photonic component.

3. The method of claim 2 wherein, based on the precise coordinates, an edge of the first optical port abuts an edge of the second optical port without an overlap or a gap.

4. The method of claim 2 wherein the second photonic component is rotated by an angle that is not a multiple of 90 degrees in its positioning.

5. The method of claim 4 wherein, based on the precise coordinates, an edge of the first optical port has a same orientation as an edge of the second optical port.

6. The method of claim 1 wherein the precise coordinates are at least 1000 times more precise than the snapped coordinates.

7. The method of claim 1 wherein the precise coordinates have sufficient precision to reduce optical loss between optical ports of components and Design Rule Checking (DRC) failure.

8. The method of claim 1 wherein, in the design database, the precise coordinates are represented as offsets from the snapped coordinates.

9. The method of claim 1 wherein the first photonic component is represented by a parameterized cell and parameters for the parameterized cell.

10. The method of claim 1 wherein the first photonic component is an optical connector.

11. The method of claim 1 wherein the first photonic component is represented by an object in the design database, and the precise coordinates are stored as part of the object.

12. The method of claim 1 wherein the photonic integrated circuit comprises electrical circuits, and the layout of the photonic integrated circuits comprises layout of the electrical circuits aligned to the fixed coordinate grid.

13. The method of claim 1 further comprising:
utilizing the design database to generate lithographic masks to fabricate the photonic integrated circuit.

14. A system comprising:
a memory storing instructions; and
a processor, coupled with the memory and to execute the instructions, the instructions when executed cause the processor to:
receive a request to place a first photonic component within a layout of a photonic integrated circuit, wherein positionings of components within the layout are represented in a design database utilizing a grid with fixed coordinates;
calculate precise coordinates and snapped coordinates for positioning of the first photonic component, wherein the snapped coordinates have a precision consistent with the fixed coordinate grid and the precise coordinates have a higher precision than the snapped coordinates, and calculating the precise coordinates comprises:
a layout design processing device transmitting to a curvilinear layout processing device the request to place the first photonic component, wherein the layout design processing device displays the layout based on the fixed coordinate grid; and
the layout design processing device receiving from the curvilinear layout processing device the precise coordinates for the first photonic component;
in the design database, representing the positioning of the first photonic component utilizing both the precise coordinates and the snapped coordinates;
using the snapped coordinates from the design database to display the layout of the photonic integrated circuit on the layout design processing device; and
using the precise coordinates from the design database in a process to fabricate the photonic integrated circuit.

15. The system of claim 14, wherein the request to place the first photonic component comprises a request to align a first optical port of the first photonic component to a second optical port of a previously placed second photonic component in the layout; and the instructions that cause the processor to calculate the precise coordinates for positioning of the first photonic component cause the processor to calculate the precise coordinates based on the precise coordinates representing the positioning of the second photonic component.

16. The system of claim 14, wherein, based on the precise coordinates, an edge of the first optical port abuts an edge of the second optical port without an overlap or a gap.

17. A non-transitory computer readable medium comprising stored instructions, which when executed by a processor, cause the processor to:
- receive a request to place a first photonic component within a layout of a photonic integrated circuit, wherein positionings of components within the layout are represented in a design database utilizing a grid with fixed coordinates;
- calculate precise coordinates and snapped coordinates for positioning of the first photonic component, wherein the snapped coordinates have a precision consistent with the fixed coordinate grid and the precise coordinates have a higher precision than the snapped coordinates, and calculating the precise coordinates comprises:
  - a layout design processing device transmitting to a curvilinear layout processing device the request to place the first photonic component, wherein the layout design processing device displays the layout based on the fixed coordinate grid; and
  - the layout design processing device receiving from the curvilinear layout processing device the precise coordinates for the first photonic component;
- represent the positioning of the first photonic component utilizing both the precise coordinates and the snapped coordinates;
- using the snapped coordinates from the design database to display the layout of the photonic integrated circuit on the layout design processing device; and
- using the precise coordinates from the design database in a process to fabricate the photonic integrated circuit.

18. The computer readable medium of claim 17, wherein the precise coordinates are represented as offsets from the snapped coordinates.

19. The computer readable medium of claim 17, wherein the photonic integrated circuit comprises electrical circuits, and the layout of the photonic integrated circuits comprises layout of the electrical circuits aligned to the fixed coordinate grid.

* * * * *